(12) United States Patent
Frougier et al.

(10) Patent No.: US 11,621,269 B2
(45) Date of Patent: Apr. 4, 2023

(54) MULTI-LEVEL FERROELECTRIC MEMORY CELL

(71) Applicant: GLOBALFOUNDRIES U.S. INC., Santa Clara, CA (US)

(72) Inventors: Julien Frougier, Albany, NY (US); Ruilong Xie, Niskayuna, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 16/298,413

(22) Filed: Mar. 11, 2019

(65) Prior Publication Data
US 2020/0295017 A1    Sep. 17, 2020

(51) Int. Cl.
| H01L 27/11514 | (2017.01) |
| H01L 27/11502 | (2017.01) |
| H01L 23/522 | (2006.01) |
| H01L 49/02 | (2006.01) |

(52) U.S. Cl.
CPC .... *H01L 27/11514* (2013.01); *H01L 23/5226* (2013.01); *H01L 27/11502* (2013.01); *H01L 28/40* (2013.01); *H01L 28/55* (2013.01)

(58) Field of Classification Search
CPC ... H01L 28/55; H01L 28/40; H01L 27/11502; H01L 2929/1441
See application file for complete search history.

(56) References Cited

U.S. PATENT DOCUMENTS

| 5,155,573 A * | 10/1992 | Abe | H01L 27/11502 257/304 |
| 6,281,535 B1 * | 8/2001 | Ma | H01L 21/76838 257/295 |
| 6,624,040 B1 * | 9/2003 | Ng | H01L 21/76811 257/E21.018 |
| 9,047,568 B1 | 6/2015 | Fisher et al. | |
| 9,195,934 B1 | 11/2015 | Hunt et al. | |
| 9,542,644 B2 | 1/2017 | Canoy et al. | |
| 9,601,546 B1 | 3/2017 | Ando et al. | |
| 9,773,204 B2 | 9/2017 | Lee | |
| 2002/0155659 A1 * | 10/2002 | Chen | H01L 28/91 438/240 |

(Continued)

FOREIGN PATENT DOCUMENTS

WO    2018194544    10/2018

OTHER PUBLICATIONS

Jerry et al., "A ferroelectric field effect transistor based synaptic weight cell", Journal of Physics D: Applied Physics, vol. 51, No. 43, Aug. 23, 2018, Abstract, 2 pages.

(Continued)

*Primary Examiner* — Phat X Cao
(74) *Attorney, Agent, or Firm* — Francois Pagette; Andrew M. Calderon; Calderon Safran & Cole, P.C.

(57) ABSTRACT

The present disclosure relates to semiconductor structures and, more particularly, to a multi-level ferroelectric memory cell and methods of manufacture. The structure includes: a first metallization feature; a tapered ferroelectric capacitor comprising a first electrode, a second electrode and ferroelectric material between the first electrode and the second electrode, the first electrode contacting the first metallization feature; and a second metallization feature contacting the second electrode.

18 Claims, 8 Drawing Sheets

(56) References Cited

U.S. PATENT DOCUMENTS

| | | | | |
|---|---|---|---|---|
| 2003/0043618 | A1* | 3/2003 | Nakura | G11C 14/00 |
| | | | | 365/154 |
| 2005/0067644 | A1* | 3/2005 | Zhuang | H01L 28/92 |
| | | | | 257/295 |
| 2006/0038217 | A1* | 2/2006 | Mikawa | H01L 27/11502 |
| | | | | 257/306 |
| 2008/0079046 | A1* | 4/2008 | Ozaki | H01L 29/66621 |
| | | | | 257/295 |
| 2009/0294906 | A1* | 12/2009 | Suzuki | H01L 27/11507 |
| | | | | 257/532 |
| 2010/0163943 | A1* | 7/2010 | Ozaki | H01L 27/11507 |
| | | | | 257/295 |
| 2011/0001141 | A1* | 1/2011 | Tanabe | H01L 27/1255 |
| | | | | 257/E27.111 |
| 2015/0027278 | A1 | 1/2015 | Lee et al. | |
| 2015/0317557 | A1 | 11/2015 | Julian et al. | |
| 2017/0033120 | A1 | 2/2017 | Lee et al. | |
| 2017/0061278 | A1 | 3/2017 | Lee | |
| 2018/0197879 | A1 | 7/2018 | Kang et al. | |
| 2020/0161250 | A1* | 5/2020 | Seo | H01L 27/222 |

OTHER PUBLICATIONS

Yoon et al., "A FeFET Based Processing-In-Memory Architecture for Solving Distributed Least-Square Optimizations", IEEE, 76th Device Research Conference (DRC), Santa Barbara, CA, 2018, 2 pages.

Jerry et al., "Ferroelectric FET analog synapse for acceleration of deep neural network training", IFFF International Electron Devices Meeting (IEDM), San Francisco, CA, 2017, 4 pages.

Ni et al., "In-Memory Computing Primitive for Sensor Data Fusion in 28 nm HKMG FeFET Technology", IEEE International Electron Devices Meeting (IEDM), San Francisco, CA, 2018, 4 pages.

Burr et al., "Neuromorphic computing using non-volatile memory", Advances in Physics: X, ISSN: (Print) 2374-6149 (Online) Journal homepage: http://www.tandfonline.com/loi/tapx20, Published Online: Dec. 4, 2016, vol. 2, No. 1, 37 pages.

Wang et al., "Recent Advances on Neuromorphic Systems Using Phase-Change Materials", Nanoscale Research Letters 12:347, DOI 10.1186/s11671-017-2114-9, 2017, 22 pages.

Taiwanese Office Action in related TW Application No. 109104095 dated Dec. 2, 2020, 13 pages.

Taiwanese Office Action in related TW Application No. 109104095 dated Jul. 6, 2021, 14 pages.

German Office Action in related DE Application No. 109104095 dated Sep. 29, 2021, 11 pages.

Notice of Allowance in related Taiwanese Application No. 109104095 dated Jun. 14, 2022, 2 pages.

* cited by examiner

MULTI-LEVEL FERROELECTRIC MEMORY CELL

FIELD OF THE INVENTION

The present disclosure relates to semiconductor structures and, more particularly, to a multi-level ferroelectric memory cell and methods of manufacture.

BACKGROUND

Ferroelectric RAM is a competitive memory technology with a large range of applications. Ferroelectric RAM (Fe-RAM, F-RAM or FRAM) is a random-access memory similar to DRAM. In FRAM, a ferroelectric layer is used instead of a dielectric layer to achieve non-volatility. FeRAM is one of a growing number of alternative non-volatile random-access memory technologies that offer the same functionality as flash memory. FRAM technology is based on 2-states cell architecture and is therefore bound to the limit of conventional binary memory systems. That is FRAM is limited to a single storage state per device.

SUMMARY

In an aspect of the disclosure, a structure comprises: a first metallization feature; a tapered ferroelectric capacitor comprising a first electrode, a second electrode and ferroelectric material between the first electrode and the second electrode, the first electrode contacting the first metallization feature; and a second metallization feature contacting the second electrode.

In an aspect of the disclosure, a multi-level FRAM cell comprises: an upper metal line and upper via; a lower metal line and lower via; and a tapered vertical ferroelectric capacitor with a first metal electrode connected to the upper via and a second metal electrode connected to the lower via.

In an aspect of the disclosure, a method comprises: forming a lower metal line and a lower via in dielectric material; forming trenches in the dielectric material above the lower via; forming tapered metal spacers on sidewalls of the trenches, and in each trench, a first of the metal spacers connecting to the lower via; forming ferroelectric material between the metal spacers on the sidewalls of the trenches; and forming an upper level via and metal lines, with the upper level via connected to a second of the metal spacers.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a multi-level ferroelectric memory cell and methods of manufacture. More specifically, the present disclosure is directed to an analogue ferroelectric memory cell using a tapered vertical ferroelectric capacitor capable of reaching different overall states of polarization within an electric field depending on an applied bitline voltage. Advantageously, the present disclosure provides a multi-level ferroelectric memory cell (FRAM) with the capacity to store multiple memory states with enhanced flexibility, new capabilities and reaching broader applications such as neuromorphic. The FRAM also exhibits short programming time, lower power usage and fast write performance.

In embodiments, the memory cell comprises an upper metal line and via and a lower metal line and via. A tapered vertical ferroelectric capacitor is provided with one metal electrode connected to the upper via and metal line and the other metal electrode connected to the lower via and metal line. The use of the tapered vertical ferroelectric capacitor enables controllability to generate a continuous range of polarization states in the capacitor depending on the applied bitline voltage. In embodiments, the memory cell can be a sigmoid neuron memory cell.

The method of forming the memory cell comprises: forming the lower metal line and lower via; forming trenches; forming an inner metal spacer inside the trenches, and in each trench, one metal spacer is connected to the lower via and the other spacer is not connected to the lower via; forming ferroelectric material between the metal spacers; and forming upper level via and metal lines in contact with the other metal spacer. The ferroelectric material and the metal spacers form a tapered ferroelectric capacitor.

The multi-level ferroelectric memory cell of the present disclosure can be manufactured in a number of ways using a number of different tools. In general, though, the methodologies and tools are used to form structures with dimensions in the micrometer and nanometer scale. The methodologies, i.e., technologies, employed to manufacture the multi-level ferroelectric memory cell of the present disclosure have been adopted from integrated circuit (IC) technology. For example, the structures are built on wafers and are realized in films of material patterned by photolithographic processes on the top of a wafer. In particular, the fabrication of the multi-level ferroelectric memory cell uses three basic building blocks: (i) deposition of thin films of material on a substrate, (ii) applying a patterned mask on top of the films by photolithographic imaging, and (iii) etching the films selectively to the mask.

Figure 1A:
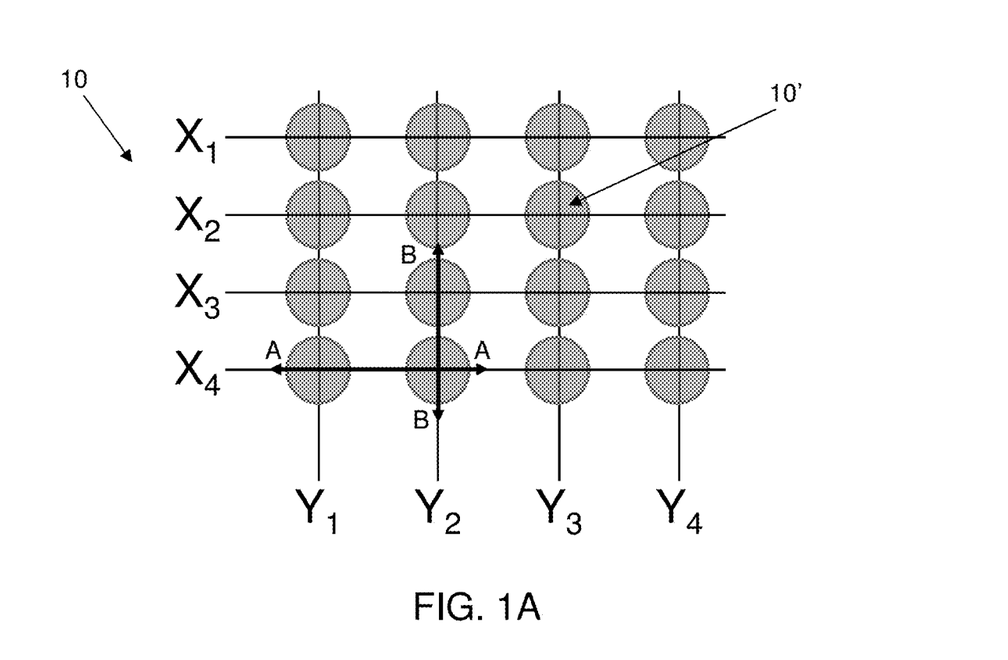
FIG. 1A is a top view of a memory array composed of multi-level FRAM cells and respective fabrication processes in accordance with aspects of the present disclosure.
Figure 1B:
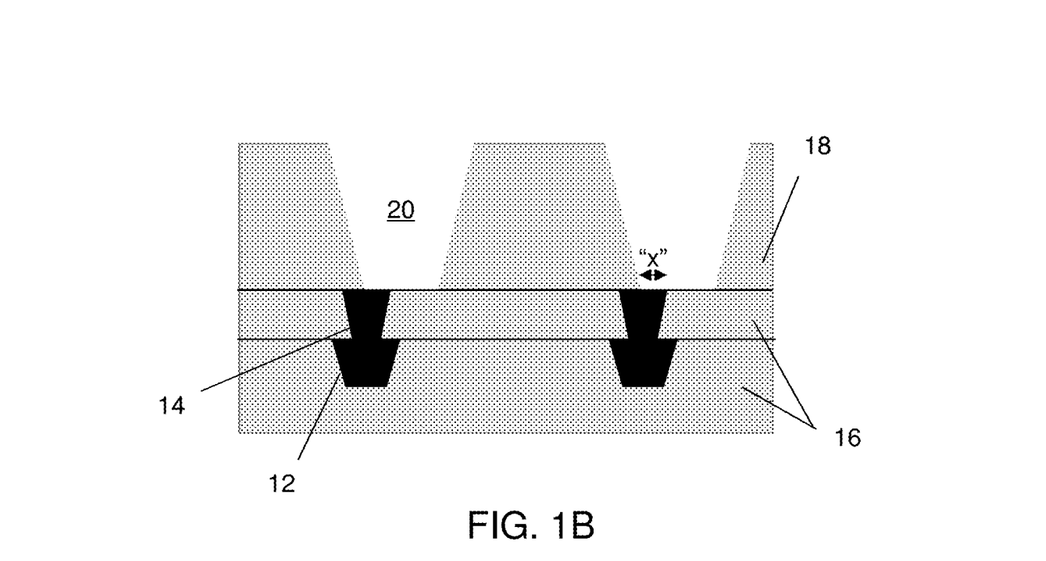
FIG. 1B is a cross-sectional view of the lower via and metal line of the memory cell along line A-A of FIG. 1A.
Figure 1C:
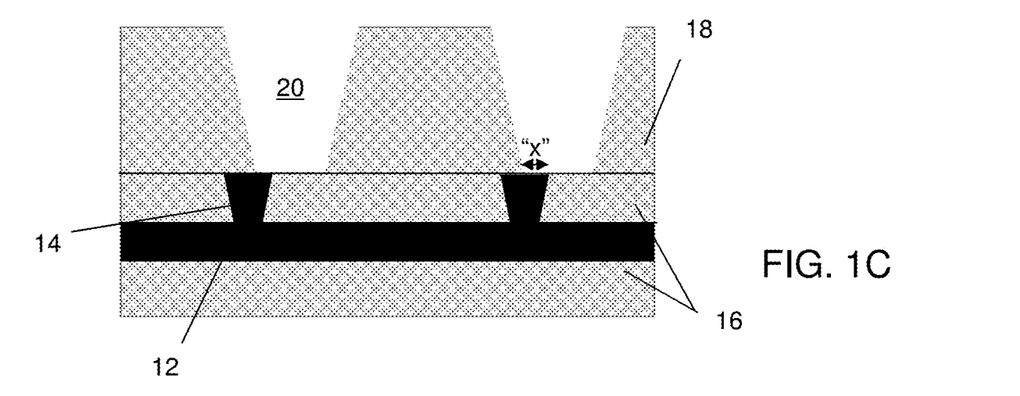
FIG. 1C is a cross-sectional view of the lower via and metal line of the memory cell along line B-B of FIG. 1A.

FIG. 1A is a top view of a memory array composed of multi-level FRAM cell and respective fabrication processes in accordance with aspects of the present disclosure. FIG. 1B is a cross-sectional view of the lower via and metal line of the memory cell along line A-A of FIG. 1A; whereas, FIG. 1C is a cross-sectional view of the lower via and metal line of the memory cell along line B-B of FIG. 1A. Referring to FIGS. 1A-1C, the memory array 10 is formed by a periodic arrangement in both X and Y directions of multiple memory cells 10' (as shown in FIG. 1A). The memory array 10 includes multiple lower metal lines 12 (Y-lines) and lower vias 14 formed in an insulator material (interlevel dielectric material) 16. In embodiments, the insulator material 16 can be an oxide based material, e.g., $SiO_2$. The metal line 12 and the lower vias 14 can be any appropriate conductive material, e.g., metal material or metal alloy, known to those of ordinary skill in the art. The memory array 10 also includes multiple upper metal lines (X-lines) and upper vias (as shown in FIG. 1A).

The metal line 12 and the lower vias 14 can be fabricated using conventional lithography, etching and deposition processes. For example, to form the lower vias 14, a resist formed over the insulator material 16 is exposed to energy (light) to form a pattern (opening). An etching process with a selective chemistry, e.g., reactive ion etching (RIE), will be used to form one or more trenches in the insulator material 16 through the openings of the resist. The resist can then be removed by a conventional oxygen ashing process or other known stripants. Following the resist removal, the conductive material (appropriate metal material or metal alloy) can be deposited by any conventional deposition processes, e.g., chemical vapor deposition (CVD) processes. Any residual material on the surface of the insulator material 16 can be removed by conventional chemical mechanical polishing (CMP) processes. The metal line 14 can be formed in a similar manner (additive process) or through a subtractive process.

After formation of the lower vias 14, additional insulator material 18 is deposited over the lower vias 14. A plurality of trenches 20 is formed in the insulator material 18, slightly offset from each of the lower vias 14. In embodiments, the distance of the offset "x" would be approximately equal to a thickness of electrode material subsequently deposited on the sidewall of the trenches 20 (e.g., tapered trenches). The trenches 20 are formed by conventional lithography and etching processes known to those of skill in the art such that no further explanation is required herein.

Figure 2A:
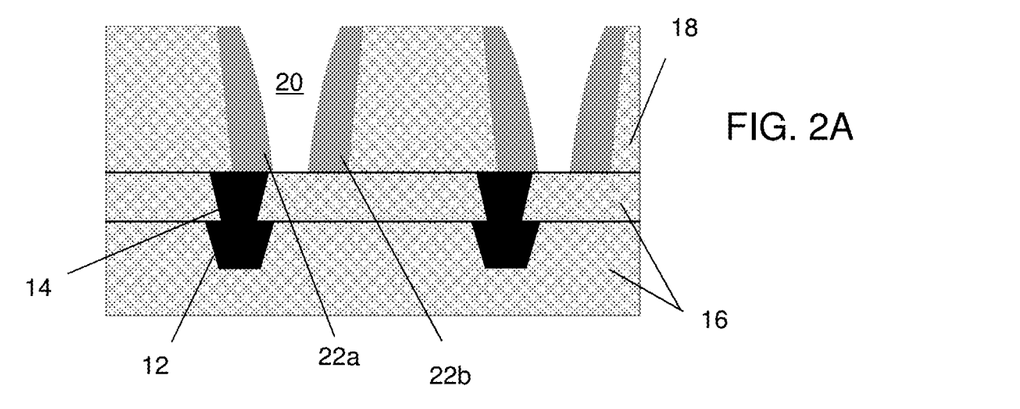
FIGS. 2A and 2B are cross-sectional views along line A-A and line B-B, respectively, of electrode material formed on the sidewalls of trenches, amongst other features, and respective fabrication processes in accordance with aspect of the present disclosure.
Figure 2B:
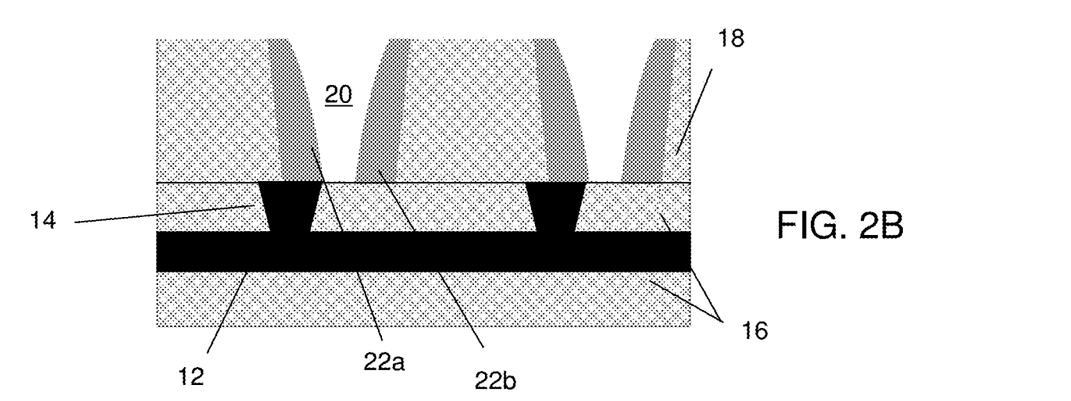

FIGS. 2A and 2B are respective cross-sectional views of electrode material formed on the sidewalls of trenches and respective fabrication processes in accordance with aspect of the present disclosure. In FIGS. 2A and 2B, electrode material is formed on the sidewalls of the trenches 20 to form a first electrode 22a and a second electrode 22b (of a capacitor) on the sidewalls of the trenches 20. Due to the tapered nature of the trenches 20, the first electrode 22a and the second electrode 22b can be non-parallel electrodes. As shown in these figures, the first electrode 22a will directly contact the lower vias 14, whereas, the second electrode 22b is remote (offset) from the lower vias 14. In embodiments, the electrode material can be TiN, copper, aluminum, tungsten or other appropriate conductive material matching the ferroelectric material operating requirement.

In embodiments, the electrode material which form first electrode 22a and the second electrode 22b is deposited by a conformal deposition of metal material without pinch-off in the trench 20. An anisotropic metal RIE will be used to taper the metal material on the first electrode 22a and the second electrode 22b (liner) in the via sidewalls. In this way, as shown in the figures, the thickness of the metal material at the top is thinner than the bottom of the via 20. Accordingly, there are two component contributing to the tapering of the capacitor sidewall contacts: (i) the natural tapering of the trenches 20 during the RIE; and (ii) the tapering of the sidewall metal material (e.g., electrodes of contacts) themselves generated by the combination of conformal metal deposition and an anisotropic RIE.

In embodiments, the electrode material can be formed on the sidewalls of the trenches 20 by a conformal deposition process, e.g., CVD, followed by an anisotropic etching process to remove the electrode material from horizontal surfaces of the insulator material 16, 18. The anisotropic etching process tapers the first electrode 22a and the second electrode 22b, with a narrow section at an upper portion of the trenches 20 and a wider section at the lower portion of the trenches 20. In embodiments, the taper can form a rounded or curved vertical side surface. For example, the tapering of the electrodes 22a, 22b can be adjusted during the anisotropic RIE process to tune the capacitor parameters, hence providing flexibility to meet multi-level FRAM design requirements.

Figure 3A:
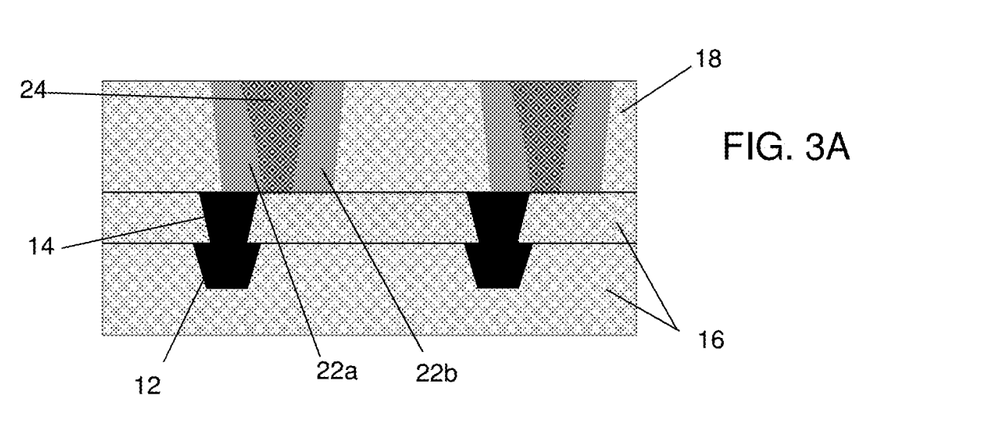
FIGS. 3A and 3B are cross-sectional views along line A-A and line B-B, respectively, of a ferroelectric material within the trenches, amongst other features, and respective fabrication processes in accordance with aspect of the present disclosure.
Figure 3B:
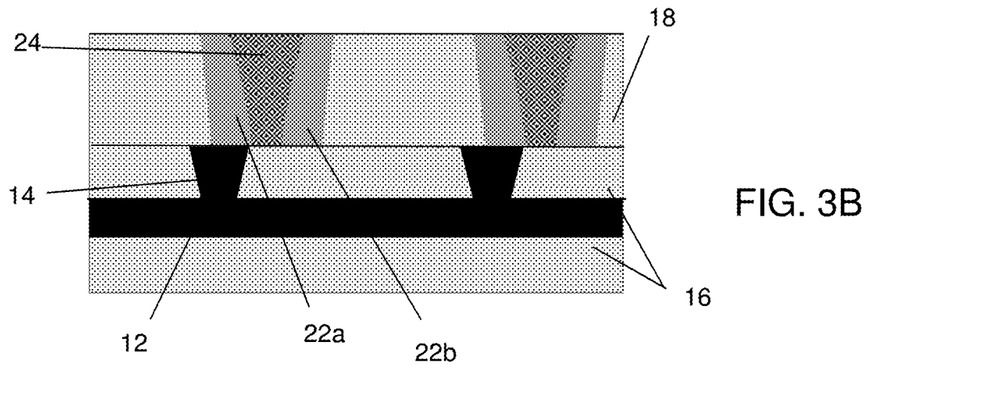

FIGS. 3A and 3B are respective cross-sectional views of a ferroelectric material within the trenches and respective fabrication processes in accordance with aspect of the present disclosure. More specifically, in FIGS. 3A and 3B, a ferroelectric material 24 is deposited into the remaining portion of the trenches 20 between the first electrode 22a and the second electrode 22b. In embodiments, examples of the ferroelectric material include, but are not limited to: doped-Hafnium Oxide or other doped high-k dielectric materials, e.g., $ZrO_2:HfO_2$, $Y:HfO_2$, $Si:HfO_2$, $Al:HfO_2$, $La:HfO_2$, etc., as well as complex oxides with Perovskite crystalline structures, e.g. $Pb(Zr,Ti)O_3$, $BiFeO_3$, $BaTiO_3$, etc.

Figure 4A:
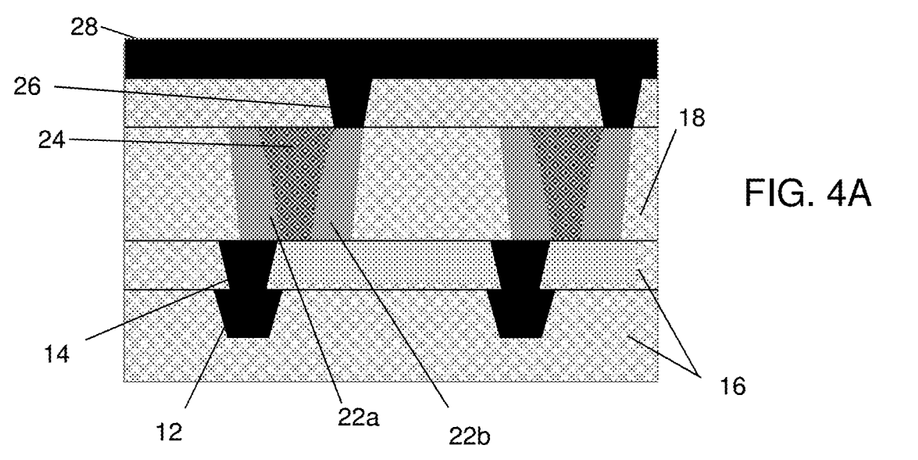
FIGS. 4A and 4B are cross-sectional views along line A-A and line B-B, respectively, of an upper metallization feature directly contacting a second electrode of a tapered ferroelectric material capacitor, amongst other features, and respective fabrication processes in accordance with aspect of the present disclosure.
Figure 4B:
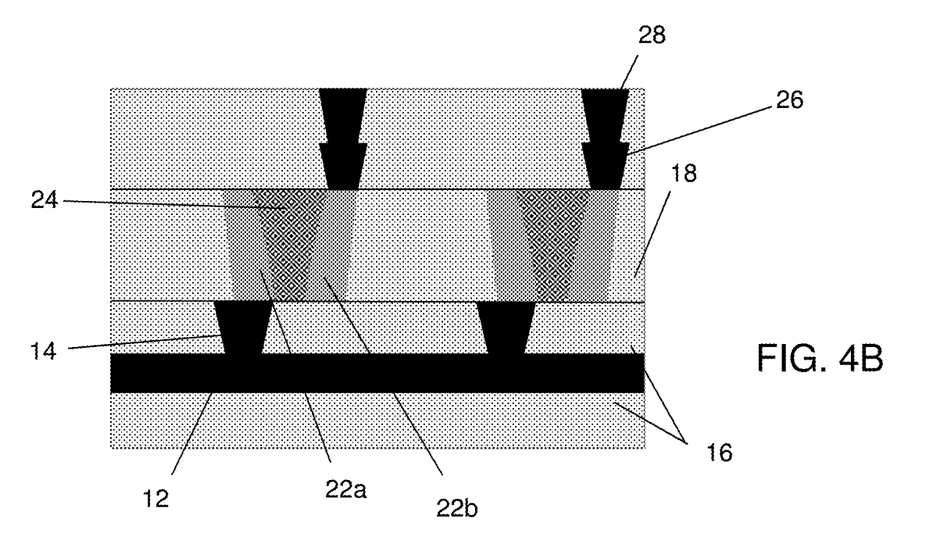

As further shown in FIGS. 3A and 3B, the ferroelectric material 24 will have a tapered profile or shape, with a narrower section at a lower portion of the trenches 20 and a wider section at the upper portion of the trenches 20. As should be understood, the ferroelectric material 24 will act as an insulator material between the two electrodes 22a, 22b, forming a capacitor with one of the electrodes 22a contacting the lower vias 14 and another of the electrodes 22b contacting upper wiring features (as shown in FIGS. 4A and 4B). The ferroelectric material 24 can be deposited by a conventional deposition process included CVD, atomic layer deposition (ALD) or plasma vapor deposition (PVD), to name a few. Following the deposition process, the ferroelectric material 24 will undergo a planarization process, e.g., chemical mechanical polishing (CMP). The planarization process can also remove a portion of the upper section of the electrodes 22a, 22b.

It should be understood by those of skill in the art that the ferroelectric material provides advantages over other insulator materials. For example, upon the application of an electric field, a spontaneous electric polarization inherent to the crystal structure of the ferroelectric material exists, which will not disappear even when the electric field is removed. In addition, in the case of complex oxides with Perovskite crystalline structures such as $Pb(Zr,Ti)O_3$ for instance, an applied external electric field will move the center atom in the direction of the electric field, which will remain in such state even after the field is removed. The position of the "central" atom affects the voltage which is used to determine whether it represents "0" or "1". In this way, by having a tapered profile of the ferroelectric material, it is possible to change the position of the central atom and, hence, permit multi-operational states (e.g., different polarization states) as different voltages are applied to the tapered ferroelectric material capacitor as is explained in more detail herein.

FIGS. 4A and 4B are respective cross-sectional views of an upper metallization feature directly contacting the second electrode of the tapered ferroelectric material capacitor, amongst other features, and respective fabrication processes. More specifically, as shown in FIGS. 4A and 4B, an upper metallization feature is formed in direct contact with the second electrode 22b (and remote or away from the first electrode 22a). In embodiments, the upper metallization feature includes an upper via 26 and an upper metal line 28. As shown in these figures, the second electrode 22b is directly contacting the upper via 26. In this way, a tapered profile ferroelectric material capacitor with two non-parallel electrodes, e.g., first electrode 22a and second electrode 22b, is formed in contact with a lower metallization feature (e.g., lower via 12 and lower metal line 14) and the upper metallization feature (e.g., upper via 26 and upper metal line 28).

Figure 5:
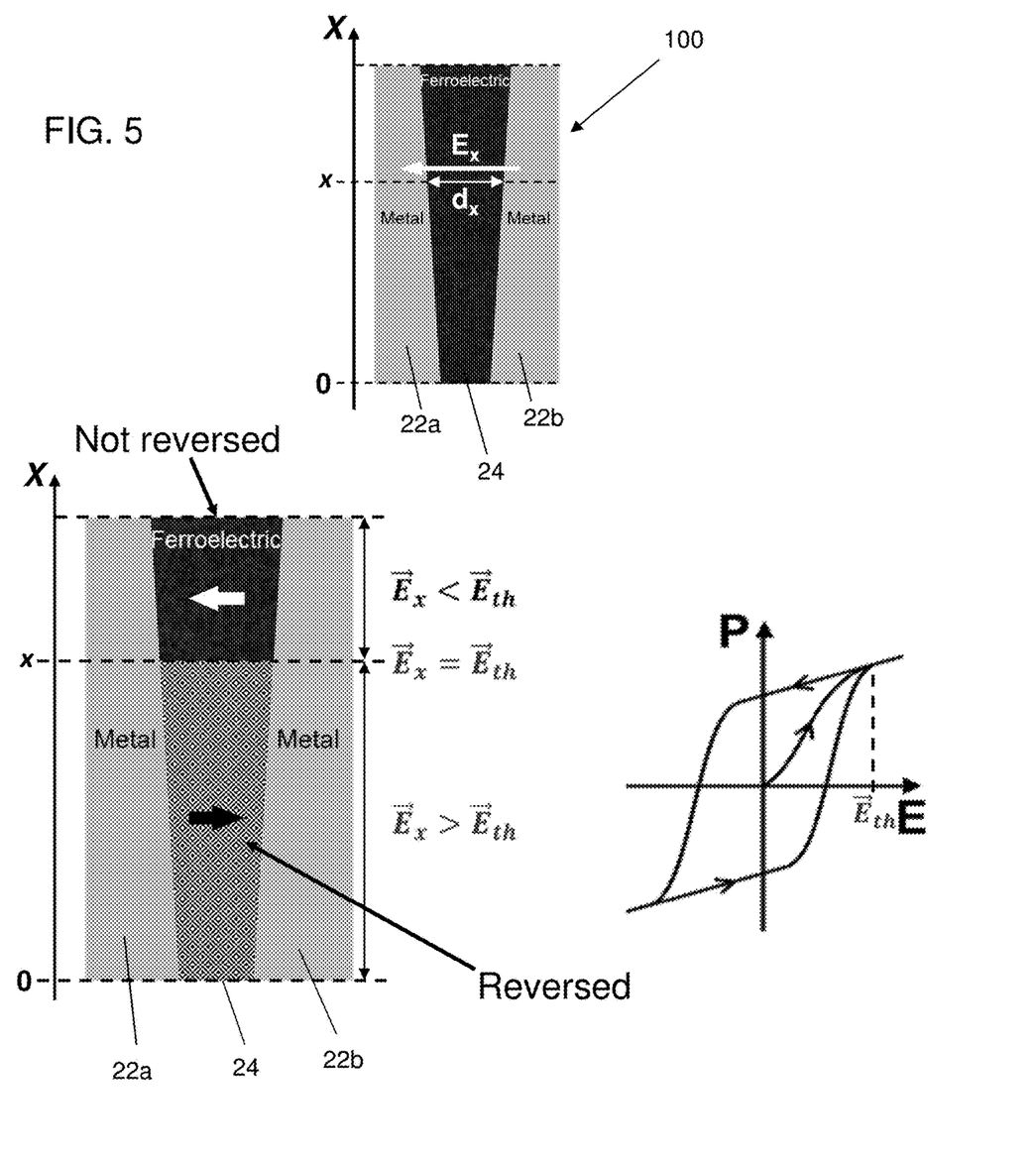
FIG. 5 shows the fundamental operating principal of the tapered ferroelectric capacitor enabling multi-level storage in accordance with aspect of the present disclosure.

FIG. 5 shows the fundamental operating principal of the tapered ferroelectric capacitor 100 enabling multi-level storage. The tapered ferroelectric material capacitor 100 exhibits the following characteristics:

$$\vec{E}_x = \frac{V_{Bit\ Line}}{d_x}$$

wherein: $E_x$ is the electric field seen by the ferroelectric material in vertical region x; $V_{Bit\ Line}$ is the voltage applied on the ferroelectric material by the bitline and is a constant for a given programing state; and $d_x$ is the thickness of the ferroelectric in vertical region x.

As should thus be understood, the electric field $E_x$ is dependent on the distance $d_x$ of the ferroelectric material between the electrodes 22a, 22b. For example, noting the above characteristics, the tapered ferroelectric capacitor 100 enables controllability to generate a continuous range of polarization states in the capacitor depending on the applied Bit line voltage. For neuromorphic applications, this can be used to create Resistive Synapses carrying multiple "weights" (e.g., multi-states), which will increase energy efficiency and density of neural networks. More specifically, in implementation, the tapered ferroelectric material capacitor can be used to form sigmoid neurons useful for deep learning.

As should now be understood by those of skill in the art, the ferroelectric material gets polarized for a given threshold electric field ($E_{th}$) which depends on the intrinsic physical properties of the ferroelectric material. If the electric field (E) applied across the ferroelectric material is above the threshold electric field ($E_{th}$) value, the ferroelectric material will get polarized along the applied field and the intrinsic electrical field in the ferroelectric material will remain once the applied electric field (E) is removed. On the other hand, if the electric field (E) applied across the ferroelectric material is below the threshold electric field ($E_{th}$) value, the ferroelectric material will not retain its internal polarization once the applied electric field (E) is removed. Since the ferroelectric capacitor is tapered: (i) one part of the ferroelectric material can experience an applied electric field (E) above the threshold electric field ($E_{th}$) value (bottom part of the capacitor which gets polarized), while (ii) the other part of the ferroelectric material experiences an applied electric field (E) below the threshold electric field ($E_{th}$) value (top part of the capacitor which does not get polarized).

Figure 6:
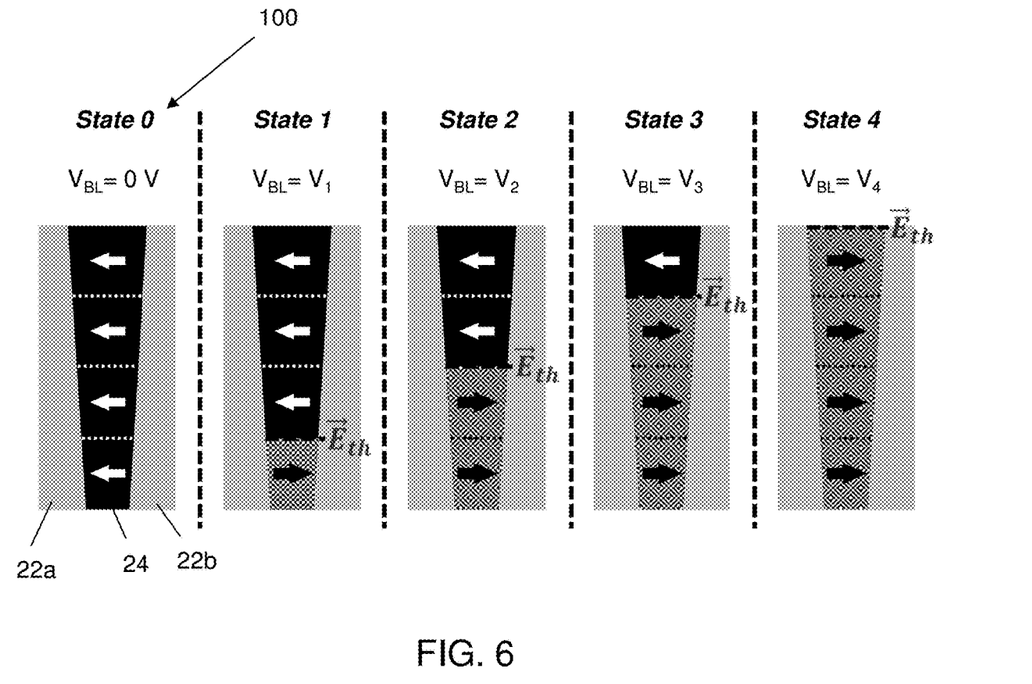
FIG. 6 shows operating states of the tapered ferroelectric capacitor enabling multi-level storage in accordance with aspect of the present disclosure.

FIG. 6 shows different operating (polarization) states of the tapered ferroelectric capacitor enabling multi-level storage in accordance with aspect of the present disclosure. More specifically, FIG. 6 shows five different states (e.g., states, 0, 1, 2, 3, 4) of the multi-operational tapered ferroelectric material capacitor 100; although other states are contemplated herein depending on the applied bitline voltages. In this example, the different bitline voltages $V_{BL}$ for each of the operational states include: $0 < V_1 < V_2 < V_3 < V_4$. As shown in each of the states, the polarization can be adjusted based on different applied bitline voltages, where the portion under the threshold electric field value ($E_{th}$) of the tapered ferroelectric capacitor 100 graphically represents a reverse polarization state. This same modeling can be used to create an FeRAM holding N number of memory states by adjusting the height and tapering of the vertical ferroelectric material capacitor.

Figure 7:
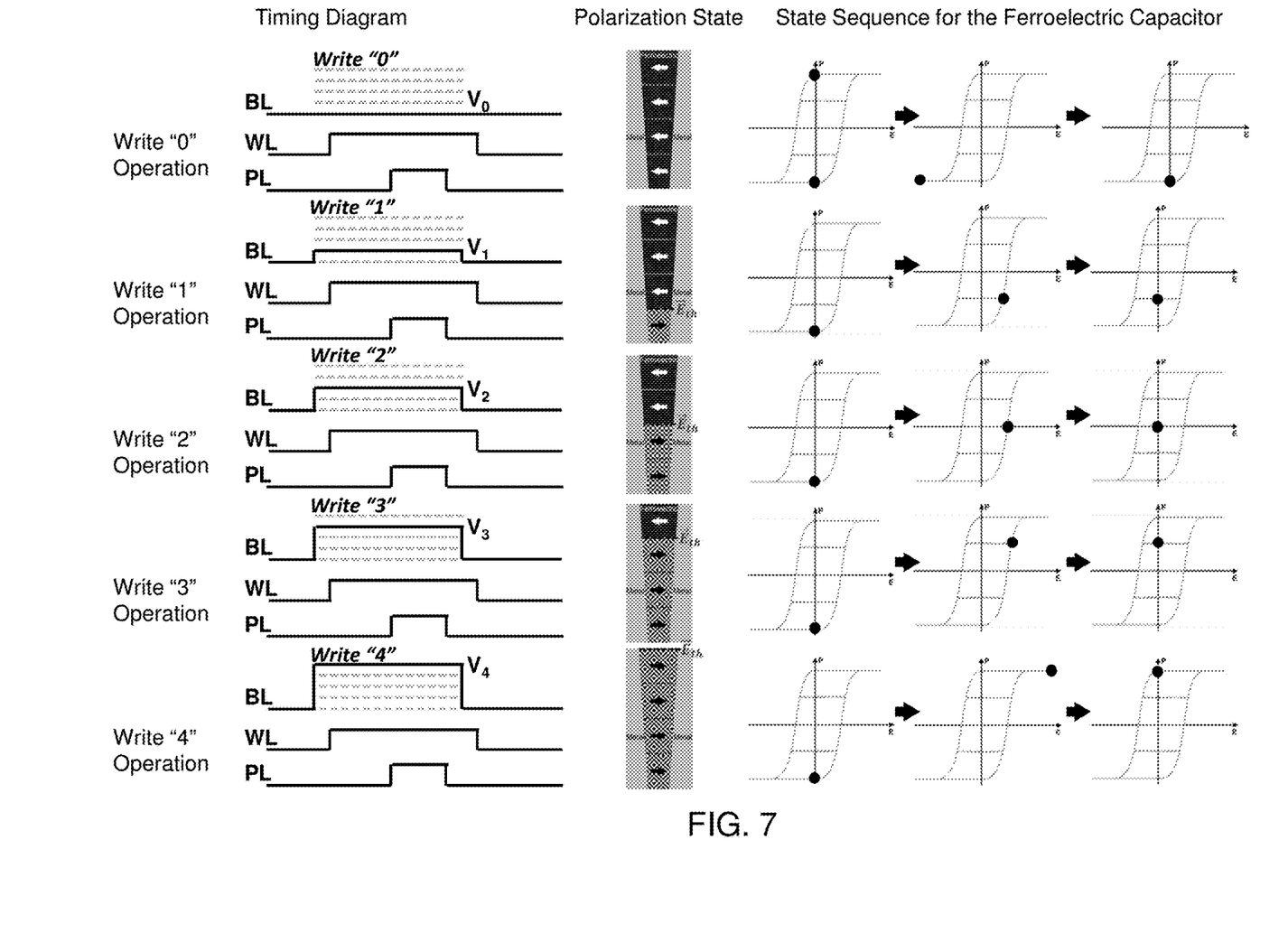
FIG. 7 shows a chart of the different operating (polarization) states of the tapered ferroelectric capacitor enabling multi-level storage in accordance with aspect of the present disclosure.

FIG. 7 shows a chart of the different operating (polarization) states of the tapered ferroelectric capacitor enabling multi-level storage in accordance with aspect of the present disclosure. The chart of FIG. 7 shows respective timing diagrams, polarization states and a state sequence of the ferroelectric capacitor described herein over five (5) write operations (i.e., write operations 0, 1, 2, 3, 4); although it should be understood that more or less states are contemplated herein. More specifically, the timing diagrams show the bitline voltage being applied to a bitline, where $V_0 < V_1 < V_2 < V_3 < V_4$. The polarization state schematically or graphically shows the polarization of the ferroelectric material capacitor during the application of each bitline voltage. For example, starting after fabrication from a randomly polarized ferroelectric capacitor (prior to any cycles), at $V_0$ the ferroelectric capacitor gets uniformly polarized in one direction (the capacitor is driven in only a single direction); whereas at $V_1$ at lower (narrower) portion of the ferroelectric capacitor is reverse polarized. As thus graphically shown in FIG. 7, as the voltage increases from $V_0$ to $V_4$, the amount of reverse polarization also will increase, effectively allowing or storing of multiple memory states. The respective graphs sequentially show the state sequence (e.g., polarization) for the ferroelectric material capacitor during the application of each bitline voltage; that is, the graphs show that the polarization is driven to a different part of the cell due it tapered shape.

Figure 8:
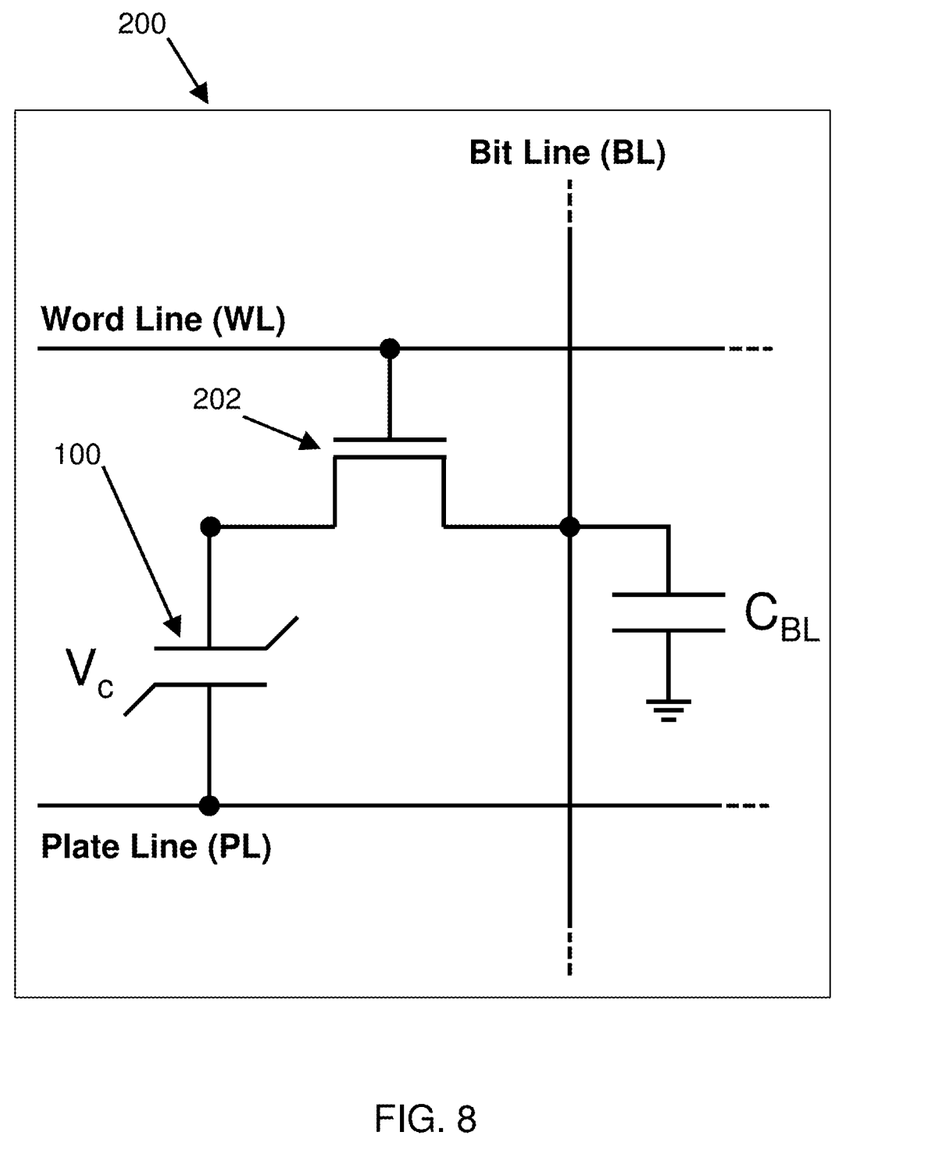
FIG. 8 shows an exemplary circuit used for the write operations of FIG. 7.

FIG. 8 shows an exemplary schematic of a circuit used for the write operations described in FIG. 7. In this schematic, the circuit 200 includes a wordline WL, a plateline PL and a bitline BL that intersects the wordline WL and the plateline PL. An access transistor 202 is connected to the wordline WL, with CBL representing a total parasitic capacitance of the bitline BL. The ferroelectric material capacitor 100 is in series with the access transistor 202 and the plateline PL. In embodiments, when the access transistor 202 is ON, the ferroelectric material capacitor 100 is connected to the bitline (BL) and can be written to or read by the plateline (PL).

In embodiments, the read operation of the multi-state FRAM could be performed using a method similar to standard FRAM. For example, the following illustrative steps can be used to for the read operation: 1) precharge the Bit line (BL) to 0 V; 2) activating the Word line (WL) establishes a capacitor divider between the Plateline (PL) and the ground; 3) depending on the data stored, the ferroelectric material capacitor 100 can be approximated by $C_0$ or $C_1$ and thus the voltage could be $V_0$ or $V_1$; 4) the Plateline (PL) is raised to $V_{DD}$; 5) at this point, the sense amplifier is activated to drive the Bitline (BL) (e.g., if the Bitline (BL) is $V_1$, then full $V_{DD}$; if the Bitline (BL) is $V_0$, then full 0 V); and 6) the Word line (WL) is kept activated until the sensed voltage on the Bitline (BL) restores the original data back into the memory cell. It should be understood, though, that the steps described above are non-restrictive and are provided only as one illustrative example.

For step 3), multiple states can be read using the total capacitance of the tapered ferroelectric material capacitor 100. For example, depending on the data stored, the ferroelectric material capacitor 100 can be approximated by $C_0$, $C_1$, $C_2$, $C_3$ or $C_4$ and thus voltage could be $V_0$, $V_1$, $V_2$, $V_3$ or $V_4$. Also, it should be recognized that similar to standard FRAM the read process would be destructive and rewriting the cell would be required after each read.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a first metallization feature on a first metal level and comprising at least a first wiring line which extends in a first direction;
    a tapered ferroelectric capacitor comprising a first tapered electrode directly contacting a first sidewall of a tapered trench in an insulator material, a second tapered electrode directly contacting a second sidewall of the tapered trench in the insulator material and a ferroelectric material comprising a tapered profile with a bottom of the tapered profile having a narrower cross-section than a top of the tapered profile, the ferroelectric material being located between and in direct contact with the first tapered electrode and the second tapered electrode in a remaining portion of the tapered trench in the insulator material, the first tapered electrode contacting the first metallization feature on the first metal level below the tapered ferroelectric capacitor; and
    a second metallization feature contacting the second tapered electrode, the second metallization feature being on a second metal level above the tapered ferroelectric capacitor and offset from the first metallization feature on the first metal level, the second metallization feature comprising at least a second wiring line which extends in a second direction, different than the first direction, wherein
    the insulator material is different material than the ferroelectric material,
    both the first tapered electrode and the second tapered electrode comprise a lower, wider section and a narrower upper section,
    the first metallization feature comprises a tapered via comprising a lower, narrower section and an upper wider section, and the upper, wider section of the tapered via of the first metallization feature directly contacts the lower, wider section of the first tapered electrode from underneath the tapered trench and the first wiring line, and
    the second metallization feature comprises a tapered via comprising a lower, narrower section and an upper, wider section, and the lower, narrower section of the tapered via of the second metallization feature directly contacts the upper, narrower section of the first tapered electrode from a top of the tapered trench.

2. The structure of claim 1, wherein the ferroelectric material is composed of a doped high-k dielectric material of a hafnium based material.

3. The structure of claim 1, wherein the tapered via of the first metallization feature comprises a lower via contacting the first wiring line and the tapered via of the second metallization feature comprises an upper via, and wherein the upper via directly contacts to the second wiring line above the upper via, and the upper, wider section of the tapered via of the first metallization feature overlaps between the lower, wider section of the first tapered electrode and a bottom surface of the insulator material.

4. The structure of claim 1, wherein the tapered ferroelectric capacitor has different polarization states.

5. The structure of claim 4, wherein the tapered ferroelectric capacitor includes multiple operational states enabling multi-level storage, the operational states including at least five different states depending on an applied bitline voltage, the different bitline voltages $V_{BL}$ for each of the operational states include: $0 < V_1 < V_2 < V_3 < V_4$ such that a polarization can be adjusted based on the different applied bitline voltages, where a portion under a threshold electric field value ($E_{th}$) of the tapered ferroelectric capacitor represents a reverse polarization state.

6. The structure of claim 1, wherein:
    the tapered ferroelectric capacitor is offset with respect to the first metallization feature and the second metallization feature such that the first metallization feature is laterally offset from the second metallization feature;
    the first metallization feature is below the tapered ferroelectric capacitor and directly contacts the first tapered electrode; and
    the second metallization feature is above the tapered ferroelectric capacitor and directly contacts the second tapered electrode.

7. The structure of claim 1, wherein the tapered ferroelectric capacitor is a vertical capacitor, and wherein:
the vertical tapered ferroelectric capacitor is provided within the tapered trench;
the first tapered electrode extends from a bottom of the tapered trench to a top of the tapered trench;
the second tapered electrode extends from the bottom of the tapered trench to the top of the tapered trench; and
the ferroelectric material extends from the bottom of the tapered trench to the top of the tapered trench.

8. The structure of claim 7, wherein an electric field varies along a height of the vertical capacitor.

9. A multi-level FRAM cell comprising:
an upper metal line extending in a first direction;
a tapered upper via contacting to the upper metal line;
a lower metal line extending in a second direction different than the first direction;
a tapered lower via being on a different metal level than the tapered upper via, and the tapered lower via being laterally offset from the tapered upper via and connecting to the lower metal line;
a tapered vertical ferroelectric capacitor within a tapered trench of insulator material between the tapered upper via and the tapered lower via, with a first tapered metal electrode directly contacting to the tapered upper via and a sidewall of the tapered trench, and a second tapered metal electrode directly contacting to the tapered lower via and an opposing sidewall of the tapered trench; and
a ferroelectric material comprising a tapered profile in a remaining portion of the tapered trench between and separating the first electrode and the second electrode,
wherein the insulator material is different material than the ferroelectric material,
the upper metal line directly contacts the tapered upper via and the tapered lower via directly contacts the lower metal line,
both the first tapered metal electrode and the second tapered metal electrode comprise a lower, wider section and a narrower upper section,
the tapered lower via comprising a lower, narrower section and an upper wider section, and the upper, wider section of the tapered lower via directly contacts the lower, wider section of the first tapered metal electrode from underneath, and
the tapered upper via comprising a lower, narrower section and an upper, wider section, and the lower, narrower section of the tapered upper via directly contacts the upper, narrower section of the first tapered electrode from a top.

10. The multi-level FRAM cell of claim 9, wherein the tapered vertical ferroelectric capacitor is composed of the ferroelectric material that has a tapered profile extending from a top of the tapered trench to a bottom of the tapered trench, positioned between the lower metal line and the upper metal line and in direct contact with the first tapered metal electrode and the second tapered metal electrode.

11. The multi-level FRAM cell of claim 10, wherein the ferroelectric material fills a remaining portion of the tapered trench.

12. The multi-level FRAM cell of claim 11, wherein the ferroelectric material is composed of a doped high-k dielectric material.

13. The multi-level FRAM cell of claim 9, wherein the lower via and the upper via each contact only a single electrode, and wherein the first tapered metal electrode and the second tapered metal electrode are within the tapered trench, with a narrow section at an upper end of the tapered trench and a wider section at a lower portion of the tapered trench.

14. The multi-level FRAM cell of claim 9, wherein the tapered vertical ferroelectric capacitor has more than two memory states.

15. The multi-level FRAM cell of claim 9, wherein the tapered vertical ferroelectric capacitor is offset with respect to the upper via and the lower via such that the lower via and the upper via are laterally offset from one another.

16. The multi-level FRAM cell of claim 9, wherein an electric field varies along a height of the tapered vertical ferroelectric capacitor.

17. The multi-level FRAM cell of claim 9, wherein
the first tapered metal electrode directly contacts a first wall of the tapered trench;
the second tapered metal electrode directly contacts a second wall of the tapered trench;
the ferroelectric dielectric material fills a remaining portion of the tapered trench between the first tapered metal electrode and the second tapered metal electrode, the ferroelectric dielectric material has a tapered profile; and
the tapered profile of the first tapered metal electrode, the second tapered metal electrode and the ferroelectric dielectric material extend from a bottom of the tapered trench to a top of the tapered trench.

18. A method, comprising:
forming a lower metal line in a first direction and a lower via, which is on a first metal level, in dielectric material;
forming tapered trenches in the dielectric material above the lower via;
forming a tapered vertical ferroelectric capacitor in the tapered trenches between the lower via and an upper via, comprising:
forming a first tapered metal electrode and a second tapered metal electrode as metal spacers directly contacting sidewalls of the tapered trenches, and in each tapered trench, the first tapered metal electrode connects to the lower via;
forming ferroelectric material comprising a tapered profile in a remaining portion of the tapered trenches between and separating the metal spacers on sidewalls of the tapered trenches, wherein a bottom of the tapered profile comprises a narrower cross-section area than a top of the tapered profile; and
forming an upper metal line in a second direction, different than the first direction, and the upper via connected to the second metal-electrode, the upper via being laterally offset from the lower via and formed on a second metal level above the tapered ferroelectric capacitor,
wherein the dielectric material is different material than the ferroelectric material,
wherein the upper via and the lower via each comprise a tapered profile comprising a lower, narrower section and an upper wider section, and
wherein the upper metal line directly contacts the tapered upper via and the tapered lower via directly contacts the lower metal line,
wherein both the first tapered metal electrode and the second tapered metal electrode comprise a lower, wider section and a narrower upper section, wherein the upper, wider section of the lower via directly contacts the lower, wider section of the first tapered metal electrode from underneath, and wherein the lower, narrower section of the upper via directly contacts the upper, narrower section of the first tapered electrode from a top.

\* \* \* \* \*